United States Patent [19]

Baldi

[11] Patent Number: 5,817,557
[45] Date of Patent: Oct. 6, 1998

[54] PROCESS OF FABRICATING TUNNEL-OXIDE NONVOLATILE MEMORY DEVICES

[75] Inventor: Livio Baldi, Agrate Brianza, Italy

[73] Assignee: SGS-Thomson Microelectronics S.r.l, Agrate Brianza, Italy

[21] Appl. No.: 792,893

[22] Filed: Jan. 31, 1997

[30] Foreign Application Priority Data

Jan. 13, 1996 [EP]  European Pat. Off. .............. 96830039

[51] Int. Cl.$^6$ ................................................ H01L 21/8247
[52] U.S. Cl. ........................... 438/264; 438/981; 438/770
[58] Field of Search ................................ 437/43, 52, 239;
148/DIG. 163; 438/236–264, 762, 770, 981

[56] References Cited

U.S. PATENT DOCUMENTS

| 5,429,970 | 7/1995 | Hong ........................................ 437/43 |
| 5,496,753 | 3/1996 | Sakurai et al. ............................. 437/43 |
| 5,580,815 | 12/1996 | Hsu et al. .................................. 437/69 |

FOREIGN PATENT DOCUMENTS 63-170968  7/1988  Japan .
63-246845  10/1988  Japan .
63-312683  12/1988  Japan .

OTHER PUBLICATIONS

Wolf et al., "Silicon Processing for the VLSI Era vol. 1: Process Technoloy", Lattice Press, pp. 516–519, 534 1986.

Wolf, "Silicon Processing for the VLSI Era vol. 3: The Submicron MOSFET", Lattice Press, pp. 495–499 1995.

*Primary Examiner*—John Niebling
*Assistant Examiner*—Richard A. Booth
*Attorney, Agent, or Firm*—Seed and Berry LLP

[57] ABSTRACT

A process including the steps of forming a gate oxide layer on a semiconductor substrate; masking the gate oxide layer with a nitride mask forming openings in the gate oxide layer using the nitride mask; and forming, at the openings, tunnel oxide regions of a thickness smaller than the thickness of the gate oxide layer. The nitride mask presents a thickness smaller than the width of the openings to improve etching of the gate oxide layer and subsequent washing. The mask also protects the covered layers when etching the gate oxide and growing the tunnel oxide regions, and is removed easily without damaging the exposed layers.

24 Claims, 5 Drawing Sheets

Fig. 21

PROCESS OF FABRICATING TUNNEL-OXIDE NONVOLATILE MEMORY DEVICES

TECHNICAL FIELD

The present invention relates to a process of fabricating tunnel-oxide nonvolatile memory devices, in particular EEPROM memories.

BACKGROUND OF THE INVENTION

As is known, EEPROM memories are programmed by storing electric charges in a floating gate region and tunneling current through a thin tunnel oxide region (Fowler-Nordheim tunneling). The tunnel oxide region is surrounded by a thicker gate oxide region. The gate oxide region is used in the sensing transistor of the cell, which is used for reading the cell. The gate oxide region is located between the floating gate region and the substrate. This structure provides for:

a) increasing the coupling coefficient between the floating gate and overlying control gate, which also depends, among other things, on parasitic capacitances, such as that between the floating gate and the substrate, and hence on the thickness of the gate oxide;

b) reducing any undesired parasitic phenomena, such as band-to-band tunneling, i.e., the presence of parasitic currents due to charges passing directly from the valence band to the conduction band of the silicon; and c) preventing electron entrapment in the source region of the cell, which would result in asymmetric aging curves, i.e., an asymmetric shift of the threshold curves of erased and written cells, which must be avoided to achieve a good degree of read reliability.

EEPROM memories also require an implanted region, normally phosphorous for N-channel cells, beneath and to the side of the tunnel oxide region and partially superimposed on the drain region of the cell. This implanted region is provided to ensure electric continuity between the substrate region beneath the tunnel oxide (tunnel area) and the drain region of the cell.

In EEPROM memories of the type described it is desirable to minimize the tunnel oxide area. The reduced tunnel oxide area significantly affects the overall area of the cell and hence the overall area of the memory itself, and so enables the fabrication of memories with smaller cells. For a given memory size, such memories can thus have a greater number of cells. Moreover, reducing the tunnel area also provides for enhanced coupling of the floating gate and control gate regions. Consequently, this explains the effort currently being made to reduce the size of the tunnel oxide region to the minimum permitted by the lithographic process by which the device is formed.

Figure 1:
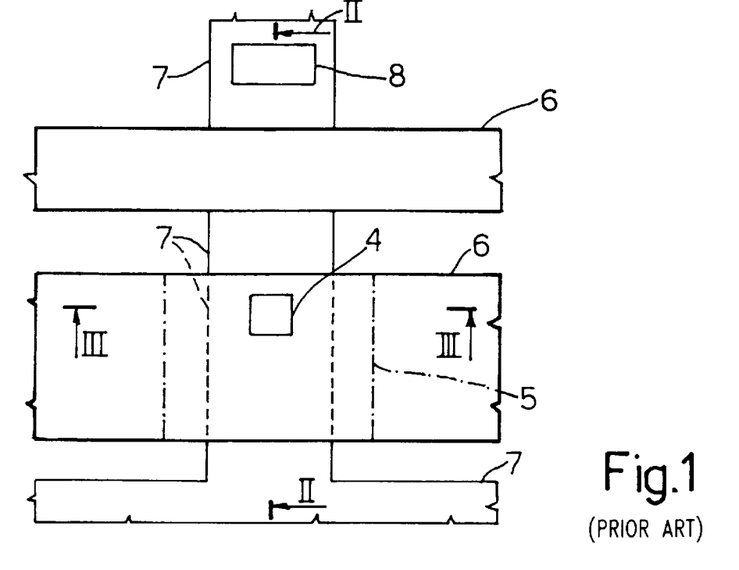
FIG. 1 shows a plan view of a number of masks used to fabricate a known EEPROM memory device.

On the other hand, current technology presents a series of problems preventing this minimum area from being achieved. This will be explained below with reference to FIGS. 1–3 showing a known EEPROM cell, and FIGS. 4–7 showing the known process by which the cell is fabricated.

Figure 2:
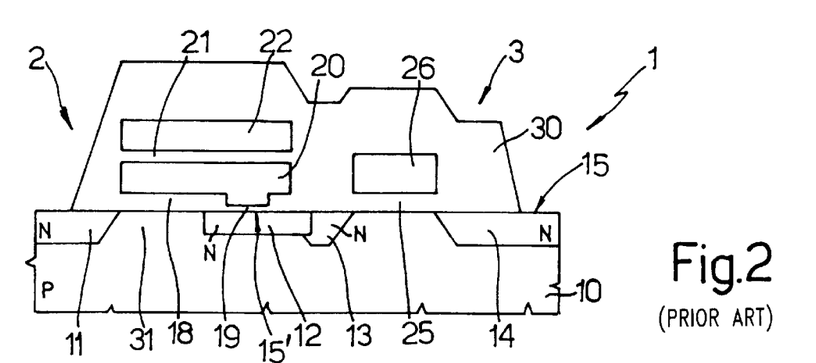
FIG. 2 shows a cross section along line II—II in FIG. 1 of the known memory device.
Figure 3:
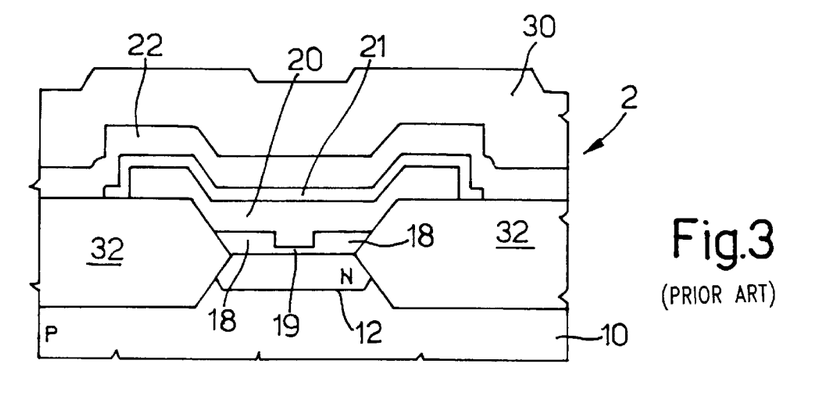
FIG. 3 shows a cross section along line III—III in FIG. 1 of the known memory device.

FIGS. 2 and 3 show a portion of a known memory device 1 comprising a cell 2 and a selection transistor 3. A P-type substrate 10 of device 1, which is formed either using or not using the twin-tub technique, includes a wafer of monocrystalline semiconductor material (silicon). The substrate contains an N-type source region 11 of the cell, an N-type implanted electric continuity region 12, an N-type drain/source region 13 defining the drain region of cell 2 and the source region of selection transistor 3, and an N-type drain region 14 for selection transistor 3. Regions 11–14 all face the surface 15 of substrate 10.

Stacked on surface 15 are the following regions forming cell 2 and the relative sensing transistor: a gate oxide region 18 of cell 2, incorporating a thin tunnel oxide region 19; a floating gate region 20 of polycrystalline silicon; an interpoly dielectric region 21; and a control gate region 22 of polycrystalline silicon. Again on surface 15 and to the right in FIG. 2 are shown a gate oxide region 25 and a gate region 26 of polycrystalline silicon, both pertaining to selection transistor 3. An intermediate dielectric layer 30 covers the structure and insulates the various layers.

As shown in FIG. 3, floating gate region 20 is insulated and surrounded at the top and sides by interpoly dielectric layer 21 and at the bottom by gate oxide 18 and tunnel oxide 19 of the cell. Interpoly dielectric layer 21 is preferably an ONO layer formed from superimposed silicon Oxide-silicon Nitride-silicon Oxide.

Portion 15' of surface 15 beneath tunnel oxide region 19 forms the tunnel area. The distance between floating gate region 20 and surface 15 is at least about 70–100 Å at portion 15', and is greater than about 200 Å at gate oxide region 18. Portion 31 of the substrate between continuity region 12 and source region 11 forms the channel of cell 2.

As shown in FIG. 3, electric continuity region 12 and channel region 31 (not shown) are defined laterally, widthwise, by a thick field oxide layer 32.

Device 1 is formed using the masks illustrated in FIG. 1, in which 4 indicates the tunnel mask; 5 (dotted line) the mask for defining the floating gate region widthwise; 6 a self-align etching mask (explained below); 7 the active area mask, also corresponding to the source/drain implant of cell 2 and selection transistor 3; and 8 a mask for forming drain contact D.

Figure 4:
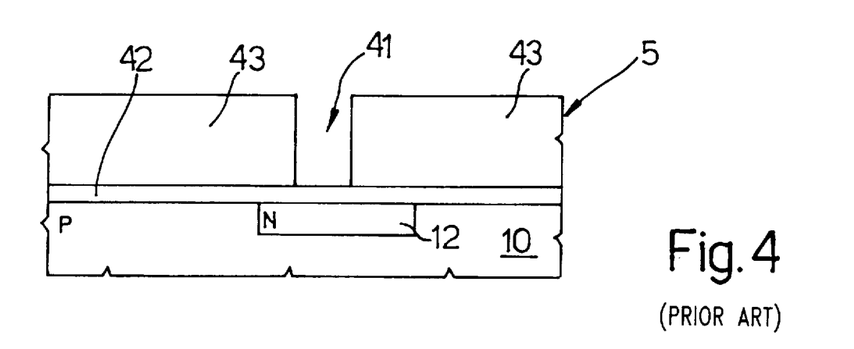
FIGS. 4–7 show cross sections, as in FIG. 2, of the memory cell of the known device at various steps in the fabrication of the cell.
Figure 5:
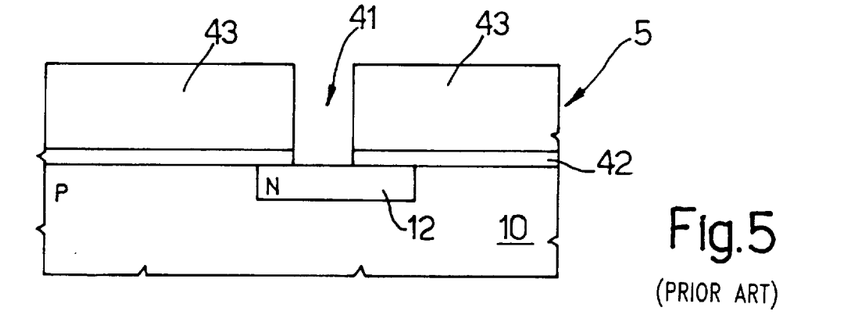

Device 1 is fabricated using a typical CMOS (twin- or single-tub) process wherein, commencing with P-type substrate 10 and using the nitride active area mask 7 covering the active area of cell 2 and transistor 3, a field oxide layer 32 (FIG. 3) is grown to define the active areas of device 1. After growing a sacrificial oxide layer and a photolithographic masking step, capacitors are implanted to form continuity region 12. Next, after removing the sacrificial oxide layer, a pre-gate oxide layer 42 is deposited. The pre-gate oxide layer 42 eventually forms part of gate region 18 of cell 2 and gate oxide region 25 of selection transistor 3. As illustrated in FIG. 4, a tunnel mask 5 is deposited, comprising a layer of photosensitive material 43 covering layer 42 except for a window 41 where tunnel region 19 is to be formed. Dedicated etching is performed to clean surface 15, remove the exposed part of layer 42, and so obtain the intermediate structure shown in FIG. 5.

Figure 6:
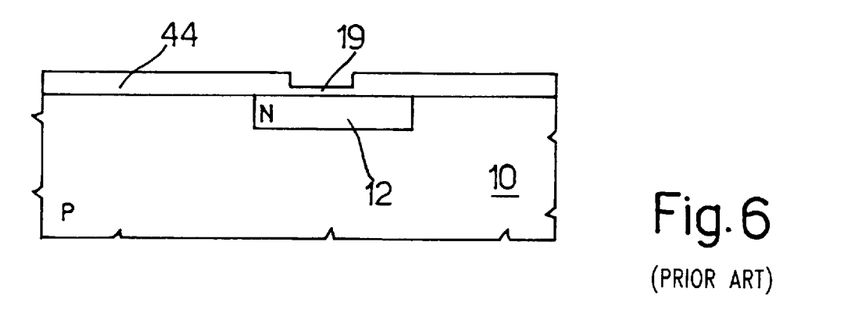

At this point, tunnel mask 5 is removed; tunnel oxide region 19 is grown; and, at the same time, the thickness of pre-gate oxide layer 42 increases to form a gate oxide layer 44 of a thickness equal to the desired final thickness of gate oxide regions 18 and 25, thus resulting in the intermediate structure shown in FIG. 6.

Figure 7:
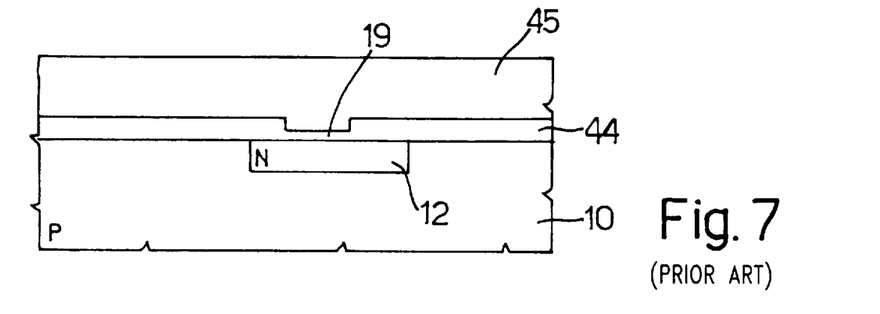

A layer of polycrystalline silicon (poly1) 45 is then deposited and doped to give the intermediate structure shown in FIG. 7. From this point forward, the process may proceed in various ways, depending on whether memories with one or two polycrystalline silicon levels are being formed, or whether or not the two polycrystalline silicon layers are shorted at the circuit transistors, etc.

A process currently employed by the Applicant, for example, comprises the steps of: masking poly1 layer 45 to define the floating gate regions 20 of the cells widthwise (horizontal direction in FIGS. 1 and 3); depositing the composite ONO layer; etching ONO layer 21 at the selection transistors and at the circuit portion of 5 device 1; depositing and doping a second polycrystalline silicon layer (poly2); depositing a tungsten silicide layer (not shown in FIGS. 2 and 3); etching the poly2 layer without removing the mask; masking and self-align etching the ONO layer and etching the poly1 layer using mask 6 to define floating gate and control gate regions 20 and 22 lengthwise (vertical direction in FIG. 1); removing mask 6; implanting source/drain to form regions 11, 13, 14; and finish steps including forming intermediate dielectric layer 30, forming the contacts and interconnecting layer(s), and depositing the passivation layer.

In the above fabrication process, the step of forming tunnel oxide region 19 is especially critical for various reasons:

1. The quality of the tunnel oxide depends to a critical extent on how thoroughly pre-gate oxide 42 is removed and surface 15 is cleaned.
2. The span of tunnel window 41 is about 0.5–0.7 μm or less, that is, much smaller than the thickness of resist layer 43 (1–1.5 μm). Consequently, when wet removing pre-gate oxide 42, a thorough wetting of the whole window 41 by the etching solution and an uniform etching of layer 42 are difficult to ensure.
3. When plasma etching to remove the exposed portion of layer 42, surface 15 of the substrate is normally damaged, thus impairing the quality of the tunnel oxide.
4. When plasma etching, residue is easily formed on account of the 25 high, closely spaced resist walls, thus resulting in contamination of surface 15 of the substrate and tunnel oxide layer 19.

No satisfactory solutions to the above problems have as yet been devised. The standard practice includes increasing the area of the tunnel oxide region, by using windows larger than the lithographic minimum or by devising ways of self-aligning the masks, or in using etching solutions also comprising a surface-active agent to improve the wettability of the surface etching step.

Nevertheless, the problem still remains. Increasing the area of the tunnel oxide region results in larger cells and very often in more complex configurations. Whereas, alterations to the etching solution must be optimized in each individual case, and do not always allow reproducible results.

SUMMARY OF THE INVENTION

It is an object of the present invention to provide a fabrication process enabling the formation of a good quality tunnel oxide region unaffected by the problems typically associated with known solutions.

According to the present invention, there is provided a process of fabricating tunnel-oxide nonvolatile memory devices, in particular EEPROM memories. The process includes the steps of forming, on a semiconductor substrate, a layer of insulating material of a first thickness. The insulating material layer is masked and an opening having a width is formed therein. Next, oxide regions of a thickness smaller than the first thickness are formed in the openings. The formed masking layers have a thickness smaller than the width of the openings, and are made from material with chemical-physical characteristics resistant to etching conditions of the layer of insulating material.

In practice, according to the present invention, when etching the pre-oxide layer, or the gate oxide layer already grown to the desired final thickness, a mask is used. The mask is made of such a material as to enable it to be made thin, i.e., thinner than the size of the desired opening in the oxide, and which is capable of selectively etching the oxide. Preferably, the mask is made of nitride.

BRIEF DESCRIPTION OF THE DRAWINGS

A number of preferred, non-limiting embodiments of the present invention will be described by way of example with reference to the accompanying drawings.

DETAILED DESCRIPTION OF THE INVENTION

In the embodiments shown in FIGS. 8–21, the regions common to the known solution in FIGS. 4–7 are indicated using the same numbering system.

Figure 8:
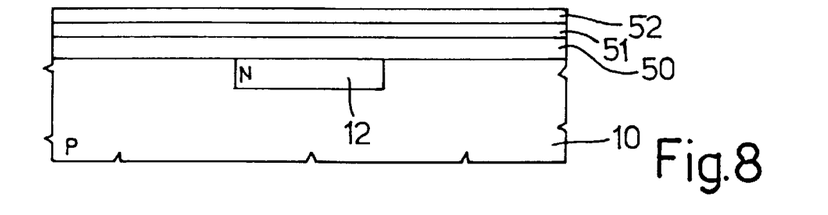
FIGS. 8–12 show cross sections, as in FIGS. 4–7, of a first embodiment of the fabrication process according to the present invention.
Figure 9:
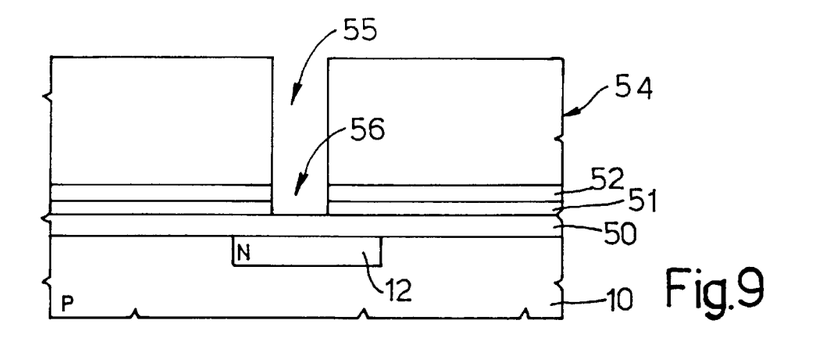
Figure 10:
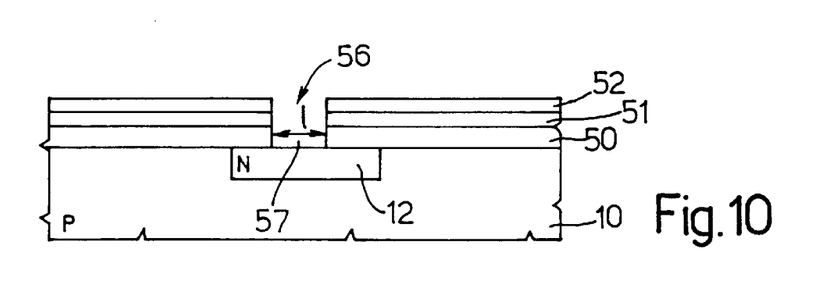
Figure 11:
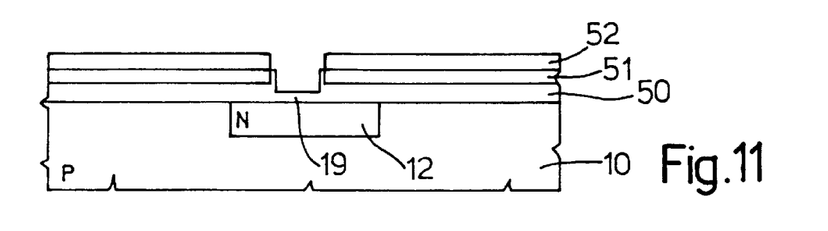

As illustrated in FIG. 8, a gate oxide layer 50 is grown on a substrate 10 of semiconductor material, typically monocrystalline silicon doped to present P-type conductivity, and housing an N-type continuity region 12. Unlike the known process described above, layer 50 already presents the desired final thickness of gate oxide region 18, as discussed above in conjunction with FIGS. 2 and 3. A thin layer that is about 20–50 nm thick of polycrystalline or amorphous silicon 51 is then deposited. The thin layer is preferably doped in situ, e.g., by adding phosphine or arsine in a known manner to the silane in the deposition furnace to improve its electric characteristics. Next, another thin layer that is about 20–50 nm thick of silicon nitride 52 is deposited to obtain the intermediate structure shown in FIG. 8.

At this point, a photolithographic masking step is performed to form a resist mask 54 presenting a window 55 at the portion in which the tunnel oxide region is to be formed. The nitride layer 52 and polycrystalline or amorphous silicon layer 51 are plasma etched to give the intermediate structure shown in FIG. 9, wherein layers 51 and 52 define a tunnel window 56 of the same area as window 55.

Mask 54 is then removed and a wash step is performed. Using the mask formed by layers 51 and 52, the exposed portion of gate oxide layer 50 is wet etched, e.g., using a diluted or buffered hydrofluoric acid solution, to give the FIG. 10 structure in which gate oxide layer 50 presents an opening 57 of width 1. The tunnel oxide region 19 is grown thermally, e.g., at T=800° C. in an environment containing dry oxygen or in the presence of traces of steam, to give the FIG. 11 structure. Since gate oxide layer 50 is masked by layers 51 and 52, tunnel oxide region 19 is only grown at window 56.

Figure 12:
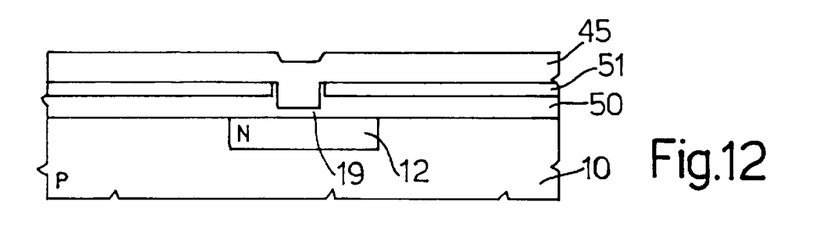

Next, nitride layer 52 is wet removed, e.g., using a hot phosphoric acid solution at 150° C.; the first polycrystalline silicon layer 45 is deposited to give the intermediate structure in FIG. 12; and the usual steps for forming intermediate dielectric 21, depositing the second polycrystalline silicon layer, patterning and implanting, etc. are performed as described above.

As stated, in the above process, opening 57 in gate oxide layer 50 is formed of width 1, of about 0.5–0.7 μm, corresponding to one side of tunnel oxide region 19, which is substantially square in shape when viewed from above. The thickness of the mask, equal to the total thickness of layers 51 and 52, i.e., 40–100 μnm, is much smaller than the width of opening 57.

Reducing the thickness of mask 51, 52 used when etching gate oxide layer 50 provides for improving the wettability of the etching window, for more uniform etching, and for more thorough washing and residue removal as compared with the known process. Moreover, after removing mask 54, nitride layer 52 permits much more thorough washing of the gate oxide surface than that permitted in the known process by the presence of exposed pre-gate oxide. For example, washing may be performed using oxide etching solutions, in particular, diluted or buffered hydrofluoric acid solutions. Finally, the process described enables the use of a wider range of solutions for etching layers 52, 51 and forming tunnel window 56, with no danger of detaching the resist layer forming mask 54.

In the above process, the protective polycrystalline or amorphous silicon layer 51 is not removed, and subsequently contacts first polycrystalline silicon layer 45 with which it forms the floating gate region. The presence of layer 51 therefore in no way interferes with the formation of cell 2.

Figure 13:
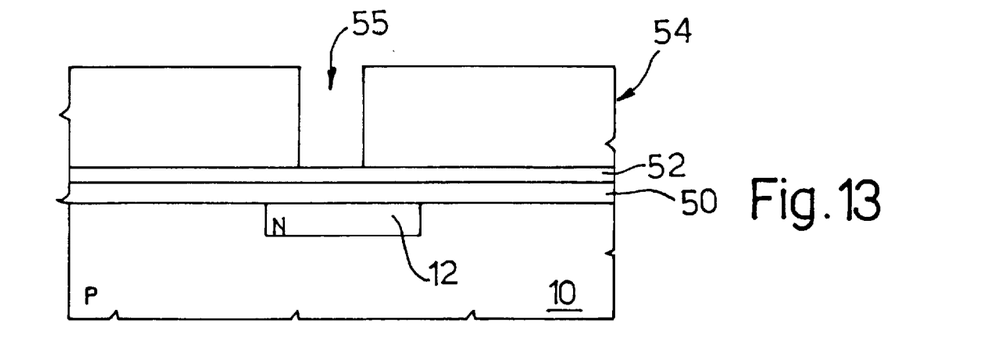
FIGS. 13–16 show cross sections of a second embodiment of the present invention.
Figure 14:
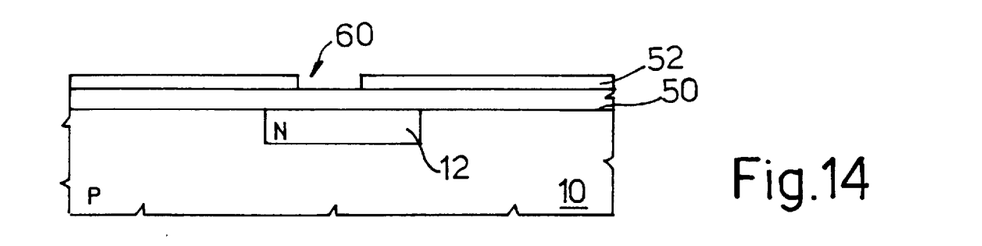
Figure 15:
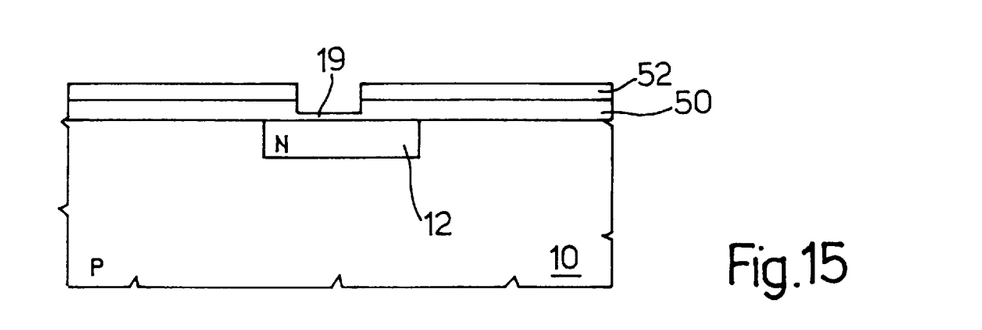
Figure 16:
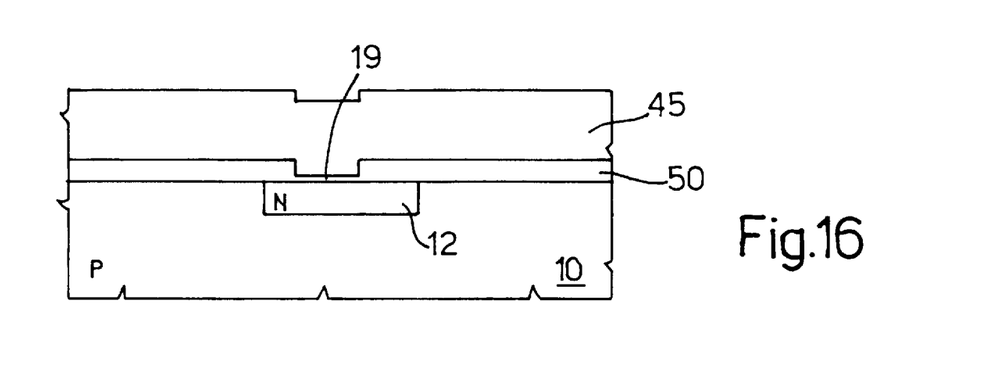

In the second embodiment illustrated in FIGS. 13-16, the nitride layer 52 is deposited directly on the gate oxide 50, and is removed after growing the tunnel oxide 19. More specifically, gate oxide layer 50 is grown on substrate 10; nitride layer 52 is grown directly on gate oxide layer 50; and tunnel mask 54 with window 55 is formed. The resultant exposed portion of nitride layer 52, of FIG. 13 is removed to form a window 60 in layer 52 and mask 54 is removed to form the structure of FIG. 14. Using the mask formed by nitride layer 52, gate oxide layer 50 is etched, and tunnel oxide layer 19 is grown at window 60 to give the structure of FIG. 15. Nitride layer 52 is removed and the usual steps are performed, including depositing the first polycrystalline silicon layer 45, as illustrated in FIG. 16, and forming the floating gate, control gate, source and drain regions of cell 2 and selection transistor 3.

Because the process for the second embodiment eliminates the polycrystalline or amorphous silicon layer 51, the resultant structure of FIGS. 13–16 is more susceptible to stress on the surface of gate oxide layer 50, due to the different coefficient of expansion of gate oxide layer 50 and nitride layer 52. Moreover, any defects (pinholes) in the nitride may result in etching of gate oxide layer 50 when forming openings 57, and hence in impaired quality of the gate oxide. For these reasons, the second embodiment is preferably limited to cases in which the process is such as to exclude the presence of pinholes in the nitride, or is such that any stress on gate oxide layer 50 is in no way critical as regards the quality of the end product.

Figure 17:
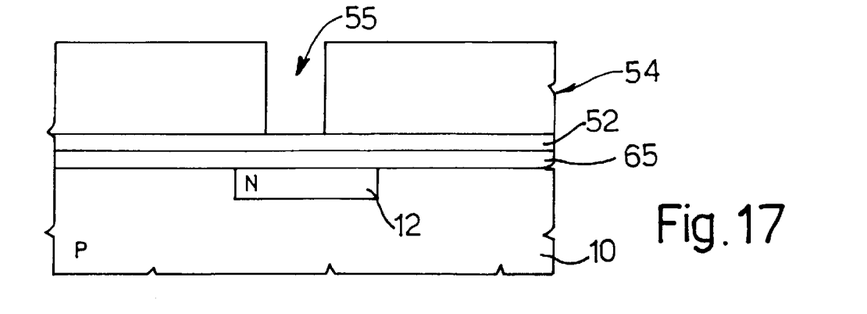
FIGS. 17–21 show cross sections of a third embodiment of the present invention.
Figure 18:
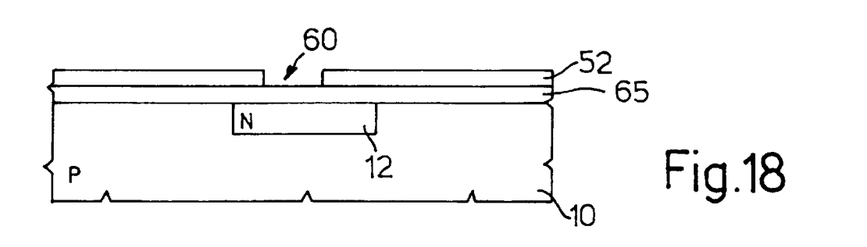
Figure 19:
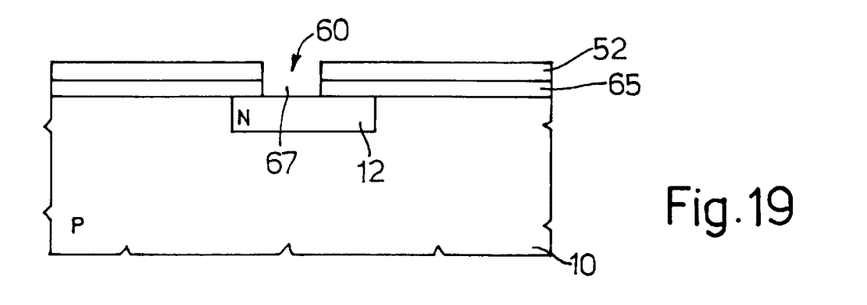
Figure 20:
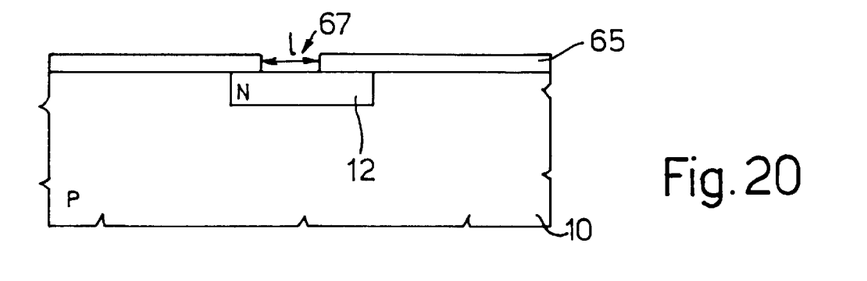
Figure 21:
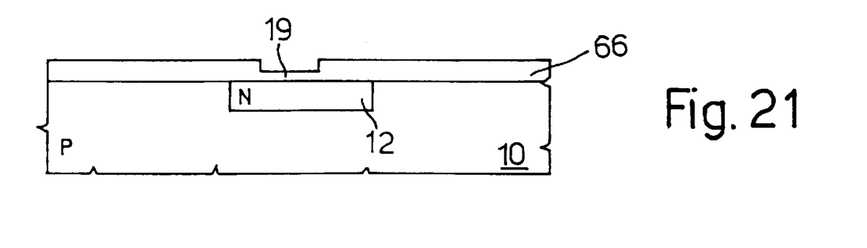

In the third embodiment of the present invention illustrated in FIGS. 17–21, the nitride layer 52 is deposited directly on a pre-gate oxide 65, and is removed after etching the oxide 65 and prior to growing the tunnel oxide 19. More specifically, FIG. 17 shows a pre-gate oxide layer 65 is grown on substrate 10; nitride layer 52 is grown on pre-gate oxide layer 65; and tunnel mask 54 with window 55 is formed. The exposed portion of nitride layer 52 is removed to form a window 60 in layer 52 and mask 54 is removed, as illustrated in FIG. 18. Using the mask formed by nitride layer 52, the exposed portion of pre-gate oxide layer 65 is etched at window 60 to form opening 67 (FIG. 19) before nitride layer 52 is removed (FIG. 20). Thereafter, thermal oxidation is performed to grow tunnel oxide layer 19, bring pre-gate oxide layer 65 up to the desired final thickness, and thus form gate layer 66. The resulting structure shown in FIG. 21 is subjected to the usual steps to form the floating gate, control gate, source and drain regions of cell 2 and selection transistor 3.

Though the third embodiment, as compared with the second, provides for greatly reducing the problem of pinholes in the nitride, the induced stress problem still remains. As a result, the third embodiment may be used to advantage when a better quality oxide than that obtainable using the second embodiment is required, and when stress is not a critical factor.

To eliminate the induced stress referred to above, according to the different solution from the embodiment of FIGS. 17–21, instead of using nitride for the masking layer for etching pre-gate oxide layer 65, the latter may be made of polycrystalline or amorphous silicon. This material is capable of shielding the oxide and is removed prior to growing tunnel oxide 19.

The advantages of the processes according to the present invention are clear from the above description and the subsequent claims to follow. In particular, using nitride as the masking material when etching oxide layer 50 or 65 is especially advantageous. The advantage is due to the nitride being depositable to a thickness equal to a fraction of the width of the tunnel oxide region of the cells (0.5–0.7 μm) while at the same time maintaining the required resistance to etching of the oxide. Moreover, the nitride is removable without damaging the existing layers, i.e., tunnel oxide 19 and polycrystalline or amorphous silicon layer 51 in the first embodiment, tunnel oxide 19 and gate oxide 50 in the second embodiment, and the silicon of substrate 10 and pre-gate oxide 65 in the third embodiment.

Clearly, changes may be made to the process as described and illustrated herein without, however, departing from the scope of the present invention. For example, though nitride is currently preferred as the masking layer material for removing portions of gate or pre-gate oxide where the tunnel oxide is to be formed, other materials with the thickness and selective oxide etching characteristics indicated may also be used. For example, in addition, as stated, to polycrystalline and amorphous silicon in the FIG. 17–21 embodiment, alumina may also be considered.

I claim:

1. A process of fabricating a tunnel-oxide region in an EEPROM comprising the steps of:

forming, on a semiconductor substrate, a layer of insulating material of a first thickness;

depositing a protective layer of polycrystalline semiconductor material over said layer of insulating material;

masking said insulating and semiconductor layers with a nitride masking layer;

forming openings in said insulating and semiconductor layers, said layers having a width greater than the thickness of said nitride masking layer; and forming, on said substrate, at said openings, tunnel-oxide regions of a second thickness, smaller than said first thickness.

2. The process of claim 1 wherein said masking step further includes the steps of:

depositing said nitride masking layer;

forming a mask of photosensitive material having first windows at said openings to be formed;

forming second windows in said nitride masking layers, at said first windows; and removing said mask of photosensitive material.

3. A process of fabricating a tunnel-oxide region in an EEPROM device, comprising the steps of:

forming, on a semiconductor substrate, a layer of insulating material having a first thickness;

covering said layer of insulating material with a layer of polycrystalline silicon;

masking said layer of insulating material with a nitride layer;

creating a window in a mask of photosensitive material;

forming a second window in said nitride layer, at said first window;

removing said mask of photosensitive material;

forming a third window in the layer of insulating material at said second windows;

removing said nitride layer; and thermally oxidizing said substrate to grow said tunnel-oxide region to a second thickness on said substrate at said third window in said layer of insulating material, and to increase said first thickness of insulating material to a third thickness, greater than the first and second thickness.

4. The process of claim 1 wherein said nitride masking layer provides a thickness of less than a quarter of said width of said opening.

5. The process of claim 2 wherein said first thickness of said layer of insulating material is equal to a final thickness; and said step of forming tunnel oxide regions further includes the step of growing said tunnel oxide regions at said second windows in said masking layer.

6. The process of claim 5 wherein said step of growing said tunnel oxide regions is followed by the steps of removing said nitride masking layer and depositing a semiconductor gate layer.

7. The process of claim 6 wherein the step of forming second windows further includes the step of removing exposed portions of said protective layer.

8. The process of claim 1 further including:

depositing a semiconductor gate layer directly onto said protective layer to form a gate electrode as a combined structure from said protective layer and said semiconductor gate layer.

9. The process of claim 1 wherein said protective layer is a doped N-type layer.

10. The process of claim 1 wherein said step of forming tunnel-oxide regions further includes the steps of removing said nitride masking layer and thermally oxidizing said substrate to grow said tunnel-oxide regions on said substrate, at said openings in said layer of insulating material, and to increase said first thickness to a third thickness greater than said first and second thicknesses.

11. A method for fabricating an EEPROM memory device having a tunnel-oxide structure, the method comprising the steps of:

forming a dielectric material by forming an oxide layer on a substrate, forming a protective polycrystalline silicon layer on the oxide layer, and depositing a nitride layer on the protective layer, the oxide layer having a first thickness;

patterning said dielectric material to expose a first region of said substrate having a width, said width being greater than said first thickness; and forming a tunnel-oxide region of a second thickness within said first region, said second thickness being less than said first thickness within said region.

12. The method of claim 11, wherein said patterning step further includes the step of forming a mask layer over said dielectric material and patterning said mask to expose said dielectric material above said region.

13. The method of claim 11, further including the step of depositing a semiconductor gate layer on said tunnel oxide region and said patterned dielectric material.

14. The method of claim 11, further including forming floating gate, control gate, and source and drain regions for said EEPROM device.

15. The method of claim 11 wherein said protective silicon layer has an N-type conductivity type.

16. The method of claim 11 wherein said step of forming a tunnel-oxide region further includes the step of oxidizing said exposed substrate region to grow said tunnel oxide region on said substrate and to increase said first thickness.

17. A method of fabricating an EEPROM memory device having a tunnel-oxide structure, comprising the steps of:

forming a region of a conductivity type in a substrate;

forming an oxide layer on said substrate;

forming a protective polycrystalline silicon layer on said oxide layer;

forming a nitride layer on said protective layer;

selectively patterning a mask layer on said nitride layer to expose an opening above said region;

removing said nitride layer;

etching said oxide, protective, and nitride layers through said opening to expose said substrate;

forming a tunnel-oxide layer within said opening;

removing said nitride layer; and depositing a polysilicon layer on a resultant structure after removing said nitride layer;

forming floating gate, control gate, and source and drain regions for said EEPROM device.

18. The method of claim 17 wherein said tunnel-oxide layer is formed by thermal oxidation.

19. The method of claim 17 wherein said oxide layer has a thickness greater than the thickness of said tunnel-oxide layer.

20. The method of claim 17 wherein said opening has a width of about 0.5–0.7 $\mu$m.

21. The method of claim 17 wherein said tunnel-oxide layer is grown thermally at a temperature of about 800° C. in an environment containing dry oxygen.

22. The method of claim 17 wherein said nitride layer is removed by a hot phosphoric acid solution at 150° C.

23. The method of claim 17 wherein said step of removing said mask further includes the step of subsequently washing a resultant structure.

24. The method of claim 17 wherein said tunnel-oxide layer is grown in the presence of traces of steam.

* * * * *

UNITED STATES PATENT AND TRADEMARK OFFICE
CERTIFICATE OF CORRECTION

PATENT NO. : 5,817,557
DATED : October 6, 1998
INVENTOR(S) : Livio Baldi

It is certified that error appears in the above-identified patent and that said Letters Patent is hereby corrected as shown below:

On title page, item [30]

Under Foreign Application Priority Data, the filing date "Jan. 13, 1996" should read--Jan. 31, 1996--.

Column 3,
Line 3, "portion of 5 device 1" should read --portion of device 1--.
Line 33, "of the 25 high" should read --of the high--.

Claim 3, "tunnel-oxide region in an EEPROM" should read --tunnel oxide section of an EEPROM--.

Claim 17, the first occurance of "removing said nitride layer" should read --removing said mask layer--.

Signed and Sealed this

Third Day of July, 2001

*Attest:*

Nicholas P. Godici

NICHOLAS P. GODICI
*Attesting Officer*   *Acting Director of the United States Patent and Trademark Office*